United States Patent [19]

Hareyama

[11] 4,270,081
[45] May 26, 1981

[54] CONSTANT-CURRENT CIRCUIT

[75] Inventor: Kyuichi Hareyama, Tokyo, Japan

[73] Assignee: Nippon Electric Co., Ltd., Tokyo, Japan

[21] Appl. No.: 83,552

[22] Filed: Oct. 10, 1979

[30] Foreign Application Priority Data

Oct. 11, 1978 [JP] Japan ................................. 53-1255611

[51] Int. Cl.³ ............................................... G05F 3/08
[52] U.S. Cl. .................................................. 323/316
[58] Field of Search ........................... 323/1, 4, 22 R; 307/297

[56] References Cited

U.S. PATENT DOCUMENTS

3,943,380  3/1976  Morgan et al. ........................... 323/1
4,016,435  4/1977  Voorman ................................. 323/4

Primary Examiner—William H. Beha, Jr.
Attorney, Agent, or Firm—Laff, Whitesel & Rockman

[57] ABSTRACT

A constant-current circuit is especially well-suited for construction as a semiconductor integrated circuit, and it is stable over a wide range of variations in power potential. The constant-current circuit produces first to third biasing potentials. A first current source produces a first current responsive to the first bias potential. A second current source produces a second current responsive to the second bias potential, and a third current source produces a third current responsive to the third bias potential. A constant current output is obtained by subtracting the second current from the sum of the first and third currents.

11 Claims, 12 Drawing Figures

FIG.1 CONSTANT CURRENT CIRCUIT (PRIOR ART)

FIG.2 CONSTANT CURRENT CIRCUIT (PRIOR ART)

CONSTANT CURRENT CIRCUIT

CONSTANT-CURRENT CIRCUIT

The present invention relates to a constant-current circuit composed of insulated-gate field effect transistors.

Recently, an integrated circuit employing insulated-gate field effect transistors (hereinafter abbreviated as FETs) such as MOS type field effect transistors are used in various fields of electric circuits, and the development found in the lowering of their manufacturing cost and the increase of the extent of an integration scale is remarkable.

Heretofore, integrated circuit employing FETs were widely used in the field of digital circuits, but their application to the field of analog circuits was relatively scarce.

In the analog circuit, especially in a high performance analog circuit such as an operational amplifier, digital-analog converter, analog-digital converter, reference voltage source circuit, etc., a constant-current circuit for stably biasing the circuit is necessitated. The above-referred analog circuits are required to operate generally in a wide power supply voltage range, and the above-mentioned constant-current circuit must be such that a stable constant current can be derived therefrom against a variation in the power supply voltage.

As means for providing such a constant-current circuit, a circuit making use of a reference voltage circuit having a constant-voltage element such as a Zener diode or the like and diffusion resistors, and a current circuit employing a depletion type FET, have been heretofore known. A break-down voltage of a Zener diode employed in the analog circuit is required to be about 4 V or less. However, in order to produce a Zener diode having such a low break-down voltage within monolithic integrated circuit, a special diffusion region having a high concentration is necessitated and thus a diffusion process must be newly added. On the other hand, in the conventional integrated circuit are employed only enhancement type FETs as FETs, and hence in order to form a depletion type FET in such an integrated circuit, for instance, an ion-implantation process must be added. The above-mentioned addition of a process would cause lowering of a manufacturing yield for the integrated circuits, and therefore, it cannot be a desirable approach for realizing the aforementioned constant-current circuit.

It is one object of the present invention to provide a constant-current circuit that can be realized with small chip area.

Another object of the present invention is to provide a constant-current circuit that can output a stable constant current against a variation of a power supply voltage.

Still aother object of the present invention is to provide a constant current circuit which can be realized with high yield.

A further object of the present invention is to provide a constant current circuit that is suitable for biasing, for instance, an analog circuit in a peripheral analog circuit arrangement controlled by a micro-processor, which analog circuit achieves circuit operations only when it is held in a select state by a chip select signal from the micro-processor but it does not consume an electric power when it is not in a select state.

According to one feature of the present invention, there is provided a constant-current circuit comprising a first series circuit including a first number l of FETs (l being a positive integer) connected in series between two terminals, a second series circuit including a second number m of FETs (m being a positive integer) connected in series between said two terminals, a third series circuit including a third number n of FETs (n being a positive integer) connected in series between the two terminals, a first current source means adapted to output a current that is dependent upon a current flowing through the first series circuit in quantity, a second current source means adapted to output a current that is dependent upon a current flowing through the second series circuit in quantity, a third current source means adapted to output a current that is dependent upon a current flowing through the third series circuit in quantity, and an output circuit means adapted to output a current obtained by subtracting the current of the second current source from the sum of the currents of the first current source and the third current source. In a preferred embodiment of the present invention, the current quantity ratio among the first, second and third current source means is selected to be $$1 : \frac{m^2(n-l)}{2(n-m)} : \frac{n^2(m-l)}{2(n-m)}.$$

According to another feature of the present invention, there is provided a constant-current circuit comprising a voltage divider circuit means for supplying a first bias voltage obtained by multiplying a voltage between two terminals (for example, power supply terminals) by a constant factor $A(0<A\leq 1)$, a second bias voltage obtained by multiplying the same voltage by a constant factor $B(0<B\leq 1)$ that is different from A, and a third bias voltage obtained by multiplying the same voltage by a constant factor $C(0<C\leq 1)$ that is different from A and B, a first current source consisting of a MOS type FET having the first bias voltage applied to its input, a second current source consisting of a MOS type FET having the second bias voltage applied to its input, a third current source consisting of a MOS type FET having the third bias voltage applied to its input, and an output circuit adapted to output a current obtained by subtracting the current of said second current source from the sum of the currents of the first current source and the third current source, in which the current ratio among the first, second and third current sources is made $$1 : \frac{A(A-C)}{B(B-C)} : \frac{A(A-B)}{C(B-C)}.$$

According to still another feature of the present invention, there is provided a constant-current circuit comprising a first bias potential source producing a first bias potential having a value of A, a second bias potential source producing a second bias potential having a value of B, a third bias potential source producing a third bias potential having a value of C, the A, B and C being different each other, a first current source means producing a first current in response to first bias potential, a second current source means producing a second current in response to the second bias potential source, a third current source means producing a third current in response to the third bias potential, and output circuit means adapted to output a current obtained by subtracting the second current from the sum of the first and third currents.

Further, there is provided a circuit where the current ratio among the first, second and third currents is:

$$1 : \frac{A(A-B)}{B(B-C)} : \frac{A(A-B)}{B(B-C)}.$$

Furthermore, there is also provided a circuit wherein the above first, second and third bias potential sources include a first number l of field effect transistors connected in series between two potential sources, a second number m of field effect transistors connected in series between two potential sources, respectively, and a third number n of field effect transistors, where the l, m and n are positive integers.

According to still another feature of the present invention, there is provided a constant-current circuit of the above-featured type, in which one of the two terminals is connected to an output of an inverter circuit, and the input of the inverter circuit is connected to a control input terminal.

The above-mentioned and other features and objects of the present invention will become more apparent by reference to the following description of its preferred embodiments taken in conjunction with the accompanying drawings, wherein:

Figure 1:
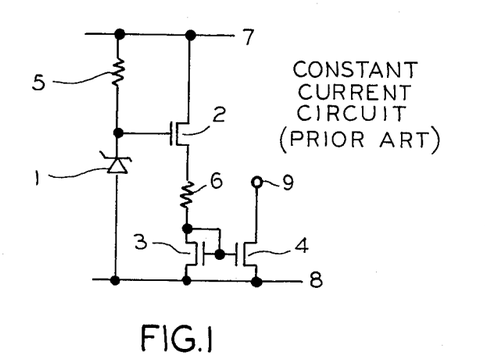
FIG. 1 is a circuit diagram of a constant-current circuit according to the prior art which makes use of a Zener diode and diffusion resistors.

Referring now to FIG. 1 of the accompanying drawings, there is shown one example of the constant-current circuit according to the prior art. This circuit comprises a Zener diode 1, N-channel FETs 2, 3 and 4, and diffusion resistors 5 and 6. Since the breakdown voltage of the Zener diode 1 is relatively constant against a voltage variation between power supply terminals 7 and 8, the voltage across the resistor 6 is also stable against the variation of the power supply voltage. Accordingly, a stable constant-current output against a variation of a power supply voltage can be obtained by deriving a current flowing through the resistor 6 from a terminal 9 by the intermediary of a current mirror circuit composed of the FETs 3 and 4.

However, in order to provide a Zener diode having such a low breakdown voltage which may operate with a low power supply voltage as deseribed above, a P-N junction having a high impurity concentration is necessary, and for realizing such a high concentration it is necessary to newly add special diffusion process. Also, the diffusion resistor 6 occupies a large chip area with respect to an active element such as an FET or the like. As described above, the prior art circuit shown in FIG. 1 is not favorable for an FET integrated circuit.

Figure 2:
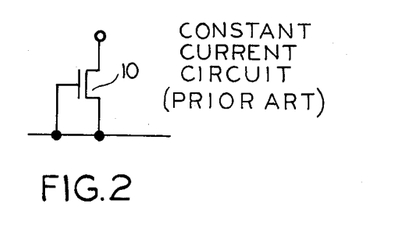
FIG. 2 is a circuit diagram showing a constant-current circuit according to the prior art which makes use of a depletion type FET.

FIG. 2 shows a prior art example of a constant current source circuit which can be realized solely by a depletion type FET 10. Although this constant current circuit is stable against a variation of a power supply voltage and is the simplest means in view of circuit construction, it is required to provide a depletion type FET having a little fluctuation in a threshold voltage in a semiconductor substrate. However, it requires newly an ion-implantation process to the process for producing an enhancement type FET. It is possible to construct most of analog circuits as well as digital circuits solely by enhancement type FETs, and in general, circuits constructed only by enhancement type FETs are prefarably manufactured by massproduction. Under such a situation it is not economical to newly add a special process for only one element in the constant-current circuit, and in practice the manufacturing yield is lowered, resulting in increase of a chip cost. Therefore, the circuit shown in FIG. 2 is not favorable for the constant-current circuit.

Figure 3:
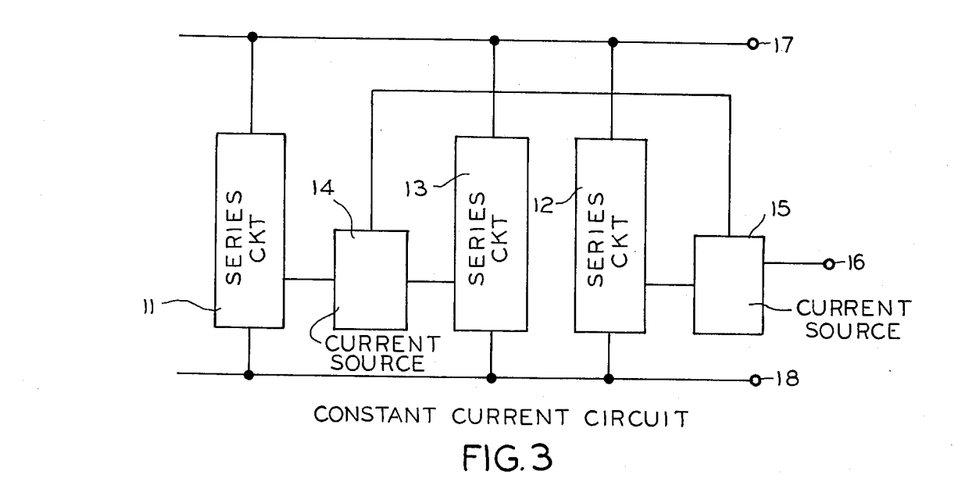
FIG. 3 is a block diagram showing a construction of a constant-current circuit according to the present invention.

Now with reference to FIG. 3, a constant-current circuit according to one preferred embodiment of the present invention will be described. In this figure, terminals 17 and 18 are connected to potential sources of low impedance such as power supply terminals or the like. Between the terminals 17 and 18 are provided a first series circuit 11 consisting of a series connection of l pieces of FETs, a second series circuit 12 consisting of a series connection of m pieces of FETs and a third series circuit 13 consisting of a series connection of n pieces of FETs, wherein l, m and n are positive integer and different each other. A current source circuit 14 is adapted to output a current corresponding to a sum of currents dependent upon the currents flowing through the first and third series circuits 11 and 13 in quantity, respectively. A current source 15 is adapted to output from its output terminal 16 a current corresponding to a difference between the current flowing through the second series circuit 12 and the output current of the current source 14 in quantity.

Now the operation principle of the above-described constant-current circuit will be explained with reference to FIG. 4. In general, current-voltage characteristics of an FET operating in a saturated region can be represented by the following equation:

$$I_d = (\beta/2)(V_G - V_t)^2 \qquad (1)$$

where mutual conductance $$\beta = \frac{W}{L} \cdot \frac{\epsilon_{OX} \cdot \mu}{t_{OX}},$$

$I_d$: a drain current of the FET, $V_t$: a threshold voltage, W: a width of a channel of the FET, L: a length of the channel, $t_{OX}$: a thickness of a gate film, $\epsilon_{OX}$: a dielectric constant of the gate film, and $\mu$: a mobility of carriess in the channel region.

Now it is assumed that in relation to the currents dependent on the first to third series circuits 11 to 13 in FIG. 3, quadratic curves which are generally represented by above Equation (1) have been obtained in three different forms as follows:

$$y_1 = a_1(b_1x - C)^2 \quad (2)$$

$$y_2 = a_2(b_2x - C)^2 \quad (3)$$

$$y_3 = a_3(b_3x - C)^2 \quad (4)$$

For the purpose of simplicity, the constant term C relating to the threshold voltage is chosen in common to all the three equations.

A difference $Y_1$ between above Equations (2) and (3) is derived as follows:

$$Y_1 = y_1 - y_2 = (a_1b_1^2 - a_2b_2^2)x^2 - 2C(a_1b_1 - a_2b_2)x + C^2(a_1 - a_2) \quad (5)$$

In a similar manner, a difference $Y_2$ between above Equations (3) and (4) is derived as follows:

$$Y_2 = y_2 - y_3 = (a_2b_2^2 - a_3b_3^2)x^2 - 2C(a_2b_2 - a_3b_3)x + C^2(a_2 - a_3) \quad (6)$$

The conditions for making the $Y_1$ and $Y_2$ linear functions of the variable x, are as follows:

$$a_1b_1^2 = a_2b_2^2 \quad (7)$$

$$a_2b_2^2 = a_3b_3^2 \quad (8)$$

When these conditions are fulfilled, a difference Y between above Equations (5) and (6) is represented by the following equation:

$$Y = Y_1 - Y_2 = -2C(a_1b_1 - 2a_2b_2 + a_3b_3)x + C^2(a_1 + a_3 - 2a_2) \quad (9)$$

In order that Equation (9) may not depend upon the variable x, it is necessary to fulfil the following condition:

$$a_1b_1 - 2a_2b_2 + a_3b_3 = 0 \quad (10)$$

Accordingly, provided that the conditions (7), (8) and (10) are simultaneously fulfilled, the difference Y becomes invariable as follows:

$$Y = C^2(a_1 + a_3 - 2a_2) \quad (11)$$

Figure 4:
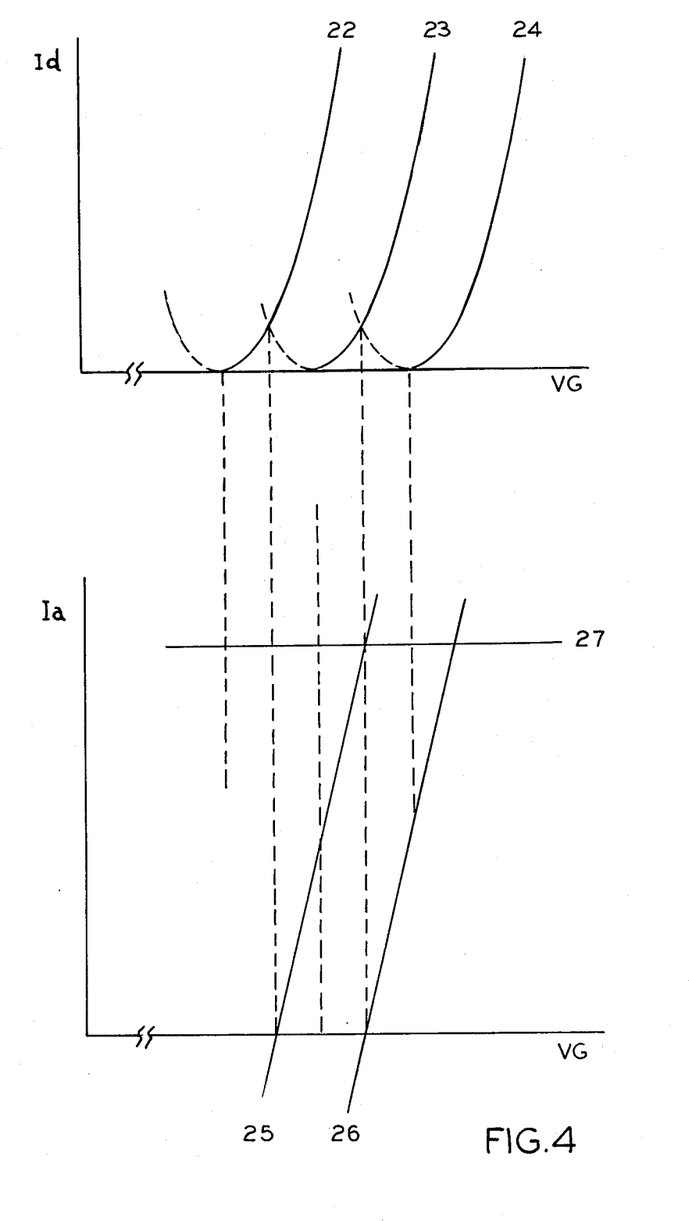
FIG. 4 is a diagram illustrating a principle of the present invention.

In FIG. 4, curves 22, 23 and 24 are quadratic curves corresponding to above Equations (2), (3) and (4). The difference between Equations (2) and (3) is represented by a straight line 25 under the condition represented by Equation (7) where the quadratic term becomes zero. Likewise the difference between Equations (3) and (4) is represented by a straight line 26 under the condition represented by above Equation (8) where the quadratic term becomes zero. The vertical distance between the straight lines 25 and 26, that is, the difference between Equations (9) and (10) above is represented by a horizontal straight line 27 under the condition represented by Equation (10) above where the linear term becomes zero.

Figure 5:
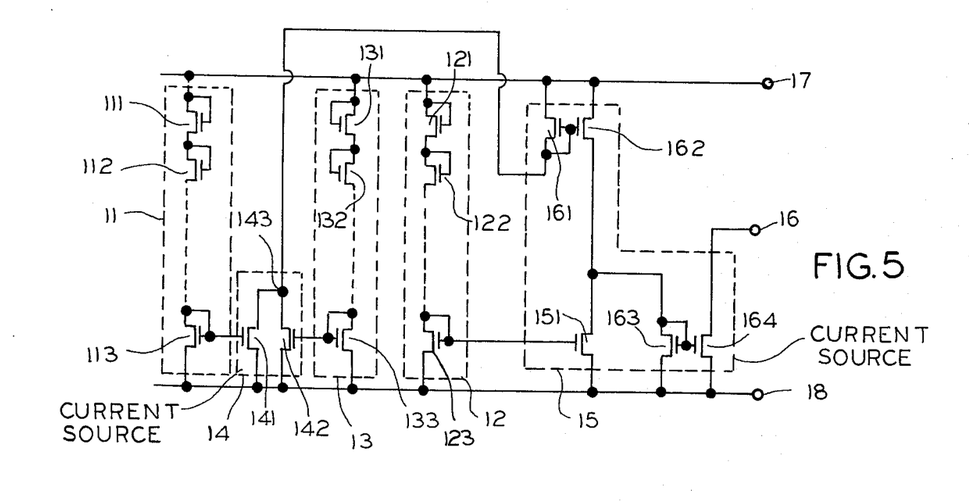
FIG. 5 is a circuit diagram showing one preferred embodiment of the present invention.

One preferred embodiment of the present invention that can operate according to the above-described operating principle is illustrated in FIG. 5, and the circuit operation of the preferred embodiment will be described now in detail with reference to FIG. 5. In this figure component parts equivalent to those illustrated in FIG. 3 are given like reference numerals. In a first series circuit 11 in which a number 1 of FETs 111, 112, ..., 113 are connected in series with their gates short-circuited to the corresponding drains, the respective FETs have the same configuration, and the current flowing through each FET is represented by the following equation:

$$Id_1 = (\beta_1/2)(V_{G1} - V_T)^2 \quad (12)$$

Likewise, in a second series circuit 12 in which a number m of FETs 121, 122, ..., 123 are connected in series with their gates short-circuited to the corresponding drains, the respective FETs have the same configuration, and the current flowing through each FET in represented by the following equation:

$$Id_2 = (\beta_2/2)(V_{G2} - V_T)^2 \quad (13)$$

Also in a similar manner, in a third series circuit 13 in which a number n of FETs 131, 132, ..., 133 are connected in series with their gates short-circuited to the corresponding drains, the respective FETs have the same configuration, and the current flowing through each said FET is represented by the following equation:

$$Id_3 = (\beta_3/2)(V_{G3} - V_T)^2 \quad (14)$$

Assuming that a voltage of $V_{DD}$ is applied between the terminals 17 and 18, then the gate-source voltages $V_{G1}$, $V_{G2}$ and $V_{G3}$ of the FETs in the respective series circuits 11 to 13 and the voltage $V_{DD}$ would satisfy the relation represented by the following equation:

$$l \cdot V_{G1} = m \cdot V_{G2} = n^{19} V_{G3} \quad (15)$$

Similarly to the differences $Y_1$ and $Y_2$ represented by Equations (5) and (6) in the explanation of the operating principle, the following equations are derived:

$$Io_1 = Id_1 - Id_2 \quad (16)$$

$$Io_2 = Id_2 - Id_3 \quad (17)$$

Also similarly to the difference Y represented by Equation (9), the following equation is derived:

$$Io = Io_1 - Io_2 = Id_1 + Id_3 - 2Id_2 \quad (18)$$

In other words, with respect to circuit constructions, a circuit having essentially the same object as the operation principle can be realized by a circuit construction in which a current twice as large as the current flowing through the second series circuit is subtracted from the sum of the current flowing through the first series circuit and the current flowing through the third series circuit.

In FIG. 5, an FET 141 constitutes a current source adapted to output a current dependent upon the current $Id_1$ flowing through the first series circuit 11. The ratio of the output current of the FET 141 to the current $Id_1$ is determined by the configuration ratios of the FET 141 and the FETs 111, 112, ..., 113 forming the first series circuit, that is, the configuration ratios of channel regions such as represented by $\beta$ in Equation (1) above.

For the sake of simplicity, the ratio between the $\beta$ is chosen to be 1. Likewise, an FET 142 outputs the current corresponding to $Id_3$ flowing through the third series circuit 13, and at a junction 143 the currents $Id_1$ and $Id_3$ are added to each other. On the other hand, a current dependent upon the current $Id_2$ flowing through the second series circuit 12 is output from an FET 151. The FET 151 has a configuration ratio relating to the mutual conductance $\beta$ twice as large as that of the FETs 121, 122, ..., 123 forming the second series circuit 12 (that is, the ratio between the $\beta$s is equal to 2), and thus the output current of the FET 151 is substantially equal to $2 Id_2$. FETs 161 and 162 are FETs having an opposite conductivity type to the other FETs in FIG. 5, and hence the current the current of $Id_1+Id_3$ added at the junction 143 is inverted by the current mirror circuit formed by the FETs 161 and 162. The sum of this inverted current $-(Id_1+Id_3)$ and a current $Id_2$ output from an FET 151, that is, a current of $2 Id_2 - (Id_1 + Id_3)$ flows through an FET 163, and thereby an output current Io inverted by a current mirror circuit formed by FETs 163 and 164, that is, a curent of $Id_1 + Id_3 - 2Id_2$ can be derived from an output terminal 16.

Substituting Equations (12), (13), (14) and (15) into Equation (18), the following equation can be derived:

$$Io = \tfrac{1}{2}(\tfrac{1}{l^2}\beta_1 + \tfrac{1}{n^2}\beta_3 - \tfrac{2}{m^2}\beta_2)V_{DD}^2 \quad (19)$$
$$- (\tfrac{1}{l}\beta_1 + \tfrac{1}{n}\beta_3 - \tfrac{2}{m}\beta_2)V_{DD}\cdot V_T$$
$$+ \tfrac{1}{2}(\beta_1 + \beta_3 - 2\beta_2)V_T^2$$

Partially differentiating Equation (19) with a variable $V_{DD}$, the following equation can be derived:

$$\frac{\partial Io}{\partial V_{DD}} = (\tfrac{1}{l^2}\beta_1 + \tfrac{1}{n^2}\beta_3 - \tfrac{2}{m^2}\beta_2)V_{DD} \quad (20)$$
$$- (\tfrac{1}{l}\beta_1 + \tfrac{1}{n}\beta_3 - \tfrac{2}{m}\beta_2)$$

In order that the output current Io may not depend upon the variable $V_{DD}$, it is only necessary that the value of Equation (20) becomes zero irrespective of the value of $V_{DD}$. That is, the necessary condition is to fulfil the following equations simultaneously:

$$\tfrac{1}{l^2}\beta_1 + \tfrac{1}{n^2}\beta_3 - \tfrac{2}{m^2}\beta_2 = 0 \quad (21)$$

$$\tfrac{1}{l}\beta_1 + \tfrac{1}{n}\beta_3 - \tfrac{2}{m}\beta_2 = 0 \quad (22)$$

The condition represented by Equation (21) corresponds to the conditions represented by Equations (7) and (8) described in the explanation of the operation principle above, and the condition represented by Equation (22) corresponds to the condition represented by equation (10) above in the same explanation. From above Equations (21) and (22), the following relation can be derived:

$$\beta_1 = 2\frac{l^2}{m^2}\cdot\frac{n-m}{n-l}\beta_2 = \frac{l^2}{n^2}\cdot\frac{n-m}{m-l}\beta_3 \quad (23)$$

Substituting Equation (23) into Equation (19) above, the following relation can be derived:

$$Io = \tfrac{1}{2}\frac{(l-m)(l-n)}{l^2}\beta_1 V_T^2 \quad (24)$$

Thus it has been proved that Io is not dependent upon the power supply voltage $V_{DD}$. Equations (23) and (24) above are basic equations for determining the parameters of the respective elements in the constant-current circuit according to the present invention. By modifying above Equation (23), the current ratio ($Id_1:2Id_2:Id_3$) among the first, second and third current sources is proved to be $$1:\frac{m^2(n-l)}{l^2(n-m)}:\frac{n^2(m-l)}{l^2(n-m)}. \quad (23')$$

Figure 6A:
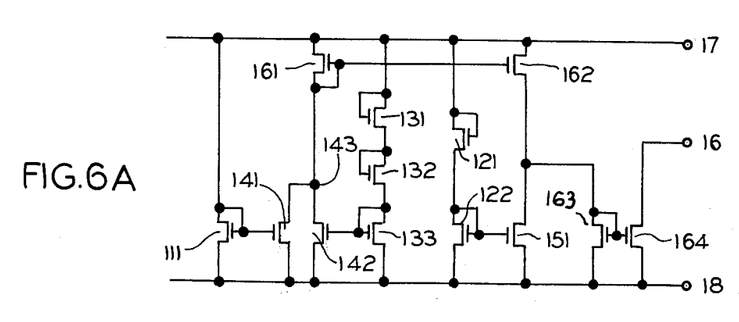
FIGS. 6(A) and 6(B) are a circuit diagram showing another preferred embodiment of the present invention and a diagram for explaining the operations of the same.

Now one example of the constant-current circuit according to the present invention which has been practically designed on the basis of the above-derived basic equations, will be explained with reference to FIG. 6. Component parts equivalent to those shown in FIG. 5 are given like reference numerals. In the example illustrated in FIG. 6, we assume the parameters $l=1$, $m=2$ and $n=3$. Then, a conditional equation corresponding to Equation (23) is as follows:

$$\beta_1 = \tfrac{1}{4}\beta_2 = \tfrac{1}{9}\beta_3 \quad (23'')$$

Also, an output current Io is represented by the following equation:

$$Io = \beta_1 V_T^2 \quad (24')$$

Under the above-described condition, the current Io, represented by above Equation (16) takes the following linear form:

$$Io_1 = \beta_1 V_T(V_{DD} - \tfrac{3}{2}V_T) \quad (16')$$

Also, the current $Io_2$ represented by Equation (17) takes the following linear form:

$$Io_2 = \beta_1 V_T(V_{DD} - \tfrac{5}{2}V_T) \quad (17')$$

Figure 6B:
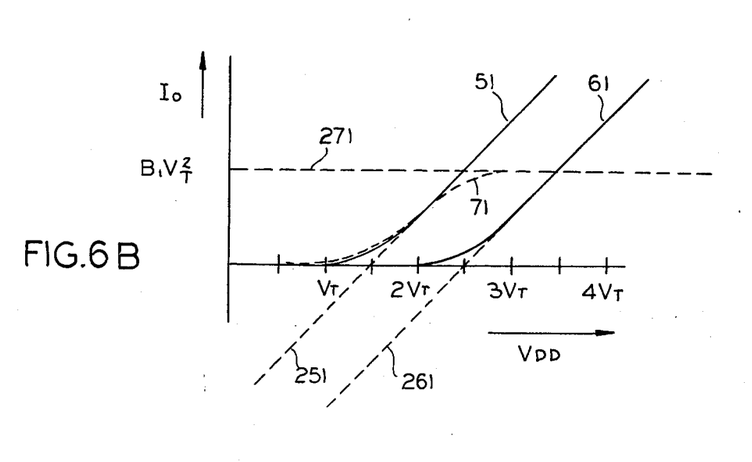

The respective straight lines corresponding to Equations (16') and (17') are depicted at 251 and 261, respectively, in FIG. 6(B). These straight lines correspond to the straight lines 25 and 26, respectively, in FIG. 4 which was referred to in the explanation of the operating principle. In a practical FET circuit, Equations (12), (13) and (14) are valid only for the gate-source voltages $V_{G1}$, $V_{G2}$ and $V_{G3}$ which are higher than the threshold voltage $V_T$, and for the gate source voltages lower than the threshold voltage $V_T$ the currents $Id_1$, $Id_2$ and $Id_3$ become zero. Therefore, the currents $Io_1$ and $Io_2$ represented by the straight lines 251 and 261 would follow, in the case of a practical circuit, solid line curves 51 and 61 in FIG. 6(B). The practical current $Io_1$ represented by the curve 51 follows a straight line for a power supply voltage of $V_{DD} \geq 2V_T$, and the practical current $Io_2$ represented by the curve 61 follows a straight line for a power supply voltage of $V_{DD} \geq 3V_T$. In addition, the practical output current Io follows, as shown by a broken line 71, a horizontal straight line 271 corresponding to Equation (24) for a power supply voltage of $V_{DD} \geq 3V_T$. Accordingly, if FETs having a threshold voltage $V_T = 1V$ are employed, then a constant current source that can supply a constant current in the power supply voltage range of $V_{DD} \geq 3V$ can be provided. In addition, it has been proved that for the values of $\beta_1 = 5.10^{-6}(A/V^2)$, $\beta_2 = 20.10^{-6}(A/V^2)$ and $\beta_3 = 45.10^{-6}(A/V^2)$, Io = 5 μA can be obtained from a terminal 16, and thus with very small elements as indicated by the values of $\beta_1$, $\beta_2$ and $\beta_3$ a very low constant current value can be obtained.

Now another preferred embodiment of the present invention will be described with reference to FIG. 7. In this figure, component parts equivalent to those shown in FIG. 5 are given like reference numerals. Reference numeral 200 designates a voltage divider circuit for dividing a voltage between input terminals 17 and 18, and one example of the details of the voltage divider circuit 200 is illustrated in FIG. 7(B). Reference numeral 201 designates a voltage supply terminal for supplying a first bias voltage obtained by dividing the voltage between the two potential source terminals 17 and 18, and in the example shown in FIG. 7(B) the voltage dividing factor A is chosen equal to ¼. Also, reference numeral 202 designates a voltage supply terminal for supplying a second bias voltage, and in the example shown in FIG. 7(B), the voltage-dividing factor B is chosen equal to ½. In addition, reference numeral 203 designates a voltage supply terminal for supplying a third bias voltage, and in the example shown in FIG. 7(B), the voltage dividing factor C is chosen equal to ¾.

Assuming now that a power supply voltage $V_{DD}$ is applied between the terminals 17 and 18, then a current $Id_1$ derived from a first current source consisting of an FET 141 biased with the above-referred first bias voltage, a current $Id_2$ derived from a second current source consisting of an FET 151 biased with the second bias voltage, and a current $Id_3$ derived from a third current source consisting of an FET 143 are represented as follows:

$$Id_1 = \frac{\beta_1}{2}(A \cdot V_{DD} - V_T)^2 \quad (25)$$

$$Id_2 = \frac{\beta_2}{2}(B \cdot V_{DD} - V_T)^2 \quad (26)$$

$$Id_3 = \frac{\beta_3}{2}(C \cdot V_{DD} - V_T)^2 \quad (27)$$

Then, an output current Io derived from a terminal 16 is calculated on the basis of Equations (25), (26) and (27) as follows:

$$\begin{aligned}Io &= Id_1 + Id_3 - 2\,Id_2 \\ &= \tfrac{1}{2}(\beta_1 A^2 + \beta_3 C^2 - \beta_2 B^2)V_{DD}^2 \\ &\quad + (\beta_1 A + \beta_3 C - \beta_2 B)V_{DD} \cdot V_T \\ &\quad + \tfrac{1}{2}(\beta_1 + \beta_3 - \beta_2)V_T^2\end{aligned} \quad (28)$$

In the above equation, the condition for making the output current Io independent of the variable $V_{DD}$, is to fulfil the relation of $$\frac{\partial Io}{\partial V_{DD}} = 0,$$

from which the following two conditions are derived:

$$\beta_1 A^2 + \beta_3 C^2 - \beta_2 B^2 = 0 \quad (29)$$

$$\beta_1 A + \beta_3 C - \beta_2 B = 0 \quad (30)$$

From Equations (29) and (23), the relation among $\beta_1$, $\beta_2$ and $\beta_3$ is derived as follows:

$$\beta_1 = \frac{B(B-C)}{A(A-C)}\beta_2 = \frac{C(B-C)}{A(A-B)}\beta_3 \quad (31)$$

Substituting Equation (31) into Equation (28), the following relation can be obtained:

$$Io = \frac{(A-B)(A-C)}{BC}\beta_1 V_T^2 \quad (32)$$

Thus it is apparent that in this preferred embodiment also the output current Io derived from the terminal 16 is not dependent upon the power supply voltage $V_{DD}$. Equations (31) and (32) are basic equations for determining the parameters of the respective elements in the constant-current circuit according to the preferred embodiment of the present invention illustrated in FIG. 7. From Equation (31), the current ratio among the first, second and third current sources is calculated as follows:

$$Id_1 : Id_2 : Id_3 = 1 : \frac{A(A-C)}{B(B-C)} : \frac{A(A-B)}{C(B-C)} \quad (33)$$

Figure 7A:
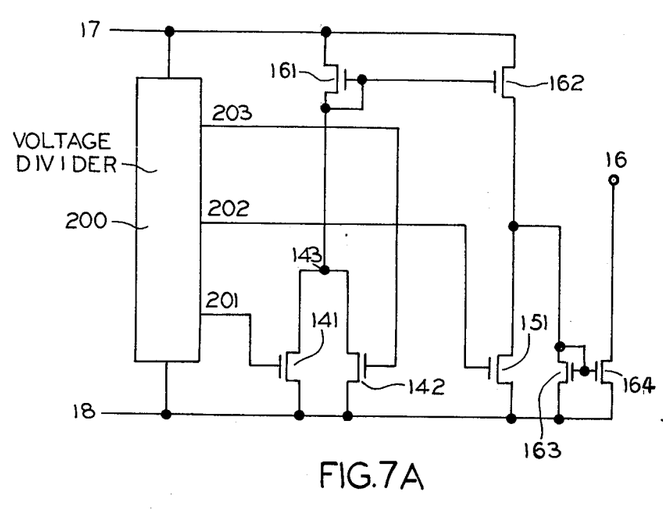
FIGS. 7(A) and 7(B) are circuit diagrams jointly showing still another preferred embodiment of the present invention.
Figure 7B:
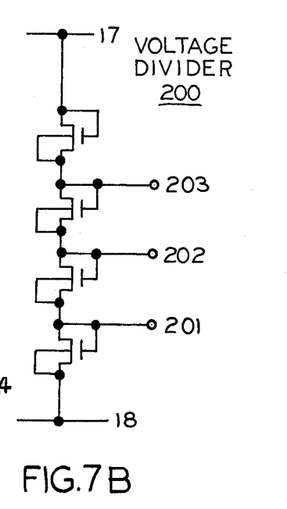

In the case of the exemplified voltage divider circuit in FIG. 7, the voltage dividing factors take the values of A = ¼, B = ½ and C = ¾, and hence, substituting these numerical values into Equation (32), we obtain, $$Io = \frac{1}{6}\beta_1 V_T^2$$

Assuming that $\beta_1 = 60.10^{-6}(A/V^2)$ is chosen, then the values of $\beta_2 = 60.10^{-6}(A/V^2)$ and $\beta_3 = 20.10^{-6}(A/V^2)$ are determined, and hence when $V_T = 1V$ is selected, Io = 10 μA can be derived.

Now, it should be noted that Equation (33) is physically equivalent to Equation (23'). Namely, the factors A, B and C in Equation (33) are respectively equivalent in their ratio to 1/l, 1/m and 1/n and Equation (33) becomes to Equation (23') by replacing A, B and C with 1/l, 1/m and 1/n. Similarly, the factors l, m and n in Equation (23') are respectively equivalent in their ratio to the factors 1/A, 1/B and 1/C and hence from above Equation (23'), Equations (33) is also introduced by replacing l, m and n in Equation (23') with 1/A, 1/B and 1/C.

Figure 8:
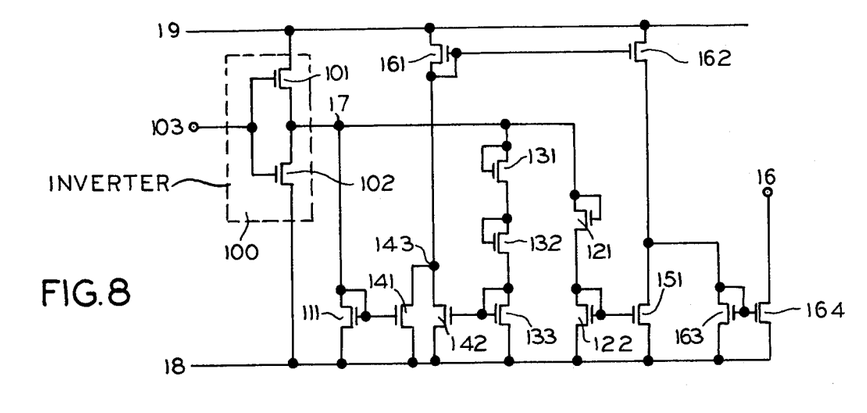
FIG. 8 is a circuit diagram showing yet another preferred embodiment of the present invention.

Next, a third preferred embodiment of the present invention will be described with reference to FIG. 8. In general, an integrated circuit composed of complementary FET elements is characterized by the fact that even when a power supply voltage is applied, a power consumption at the time when the circuit is not operating is very small. For instance, in a system where an operation of an analog-digital (A/D) converter is controlled by a micro-computer, it is possible to reduce a power consumption in an analog circuit such as an A/D converter or the like by providing circuit means in which a constant-current circuit supplies a constant current when the A/D converter is set at an operating state in response to a control signal from the micro-computer, but the constant-current circuit stops supply of the constant current when the A/D converter is held inoperative. In FIG. 8, reference numeral 103 designates a control terminal, and a control signal applied to this terminal 103 is inverted and impedance-transformed by an inverter circuit 100 consisting of complementary FETs 101 and 102 and appears at a junction 17. When the constant-current circuit is brought into an operating condition, the FET 101 is turned ON, so that the junction 17 takes a potential that is determined by the voltage-dividing ratio of the impedance of the constant-current circuit is viewed from this junction 17 to the impedance of the FET 101. Although this potential at the junction 17 can be hardly maintained constant, the constant-current circuit section can supply a stable constant current from its output terminal 16 against a wide range of voltage variation at the junction 17, as described previously. On the other hand, when the constant-current circuit is switched to its inoperative condition, the FET 101 is turned OFF and the FET 102 is turned ON, so that a current does not flow through any element in the constant-current circuit, and thereby the supply of a current from the output terminal 16 is interrupted.

Now further improvements in the constant-current circuit according to the present invention will be described. In the preferred embodiments of the present invention shown in FIGS. 6 and 7, if the input voltage (for instance, a power supply voltage) applied between the terminals 17 and 18 should become extremely high, then the currents $Id_1$, $Id_2$ and $Id_3$ flowing through the respective series circuits would be increased largely as illustrated by the curves 22, 23 and 24 in FIG. 4. Accordingly, in the preferred embodiments shown in FIGS. 6 and 7, there is a possibility that the precision of the constant current value may be lowered when a high input voltage is applied.

Figure 9A:
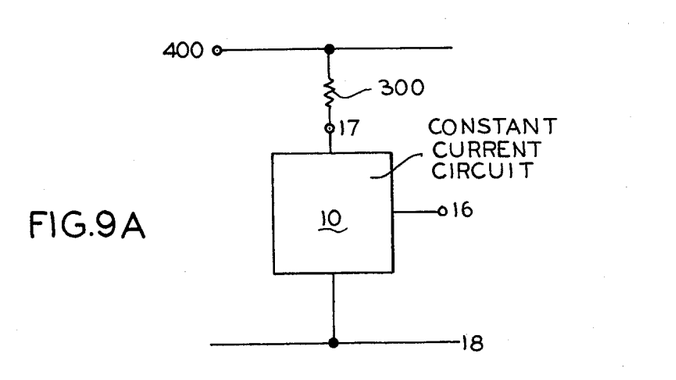
FIGS. 9(A) and 9(B) are a block diagram and a circuit diagram, respectively, showing a further improvement in the constant-current circuit according to the present invention.

In the example of the improved design illustrated in FIG. 9, by providing a circuit in which upon increase of the input voltage the increase of the voltage applied practically to the constant-current circuit according to the present invention can be suppressed, a stability of the circuit is enhanced and also an increase of the power consumption is suppressed. In FIG. 9(A), reference numeral 10 designates a constant-current circuit according to the present invention as shown in FIGS. 6 and 7, numeral 300 designates a resistor and numeral 400 designates a newly added input terminal. Owing to the insertion of the resistor 300, as the input voltage is increased, a voltage drop across the resistor 300 increases, so that the current flowing through the series circuit in the constant-current circuit 10 deviates from the quadratic characteristics and approximates to linear characteristics. Consequently, an abrupt increase of the current can be suppressed, and owing to the suppression of the current through the series circuit, the precision in the output current can be enhanced.

Figure 9B:
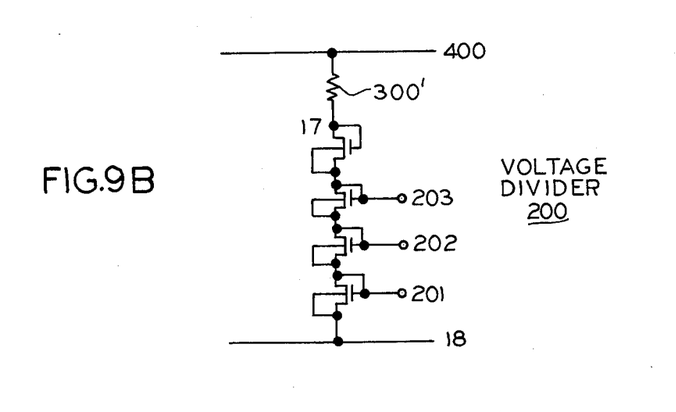

The same advantage can be also obtained in the improved embodiment illustrated in FIG. 9(B), in which a resistor 300 is inserted between the input terminal 17 of the voltage divider circuit 200 in the preferred embodiment of the present invention illustrated in FIG. 7 and the newly added input terminal 400.

If the voltage at the junction 17 in FIGS. 9(A) and 9(B) is represented by $V_{DD}'$, and if the symbol $V_{DD}$ in the explanation starting from Equation (15) and in the explanation starting from Equations (25), (26) and (27) is replaced by the symbol $V_{DD}'$, then it will be clearly understood that the operation of the constant-current circuit itself does not change essentially.

In general, since the current flowing through the resistor 300 in FIG. 9(A) is larger than the current flowing through the corresponding resistor 300' in FIG. 9(B), the resistor 300 in FIG. 9(A) can have a smaller resistance value, and hence the circuit in FIG. 9(A) is more practicable as an integrated circuit.

As described above, the constant-current according to the present invention provides means for supplying a small constant current against a wide range of variation of a power supply voltage. Moreover, upon realizing this circuit in an integrated circuit, resistors having a high resistance value are not necessitated, and only such active elements that only a small occupation area is required upon circuit integration are employed. In addition, the present invention provides circuit means having a high practicability for circuit integration which does not involve any special change nor addition of processes, and therefore, it largely contributes to the development in the field of the art.

What is claimed is:

1. A constant-current circuit comprising a first series circuit including a first number l of field effect transistors (l being a positive integer) connected in series between two potential, a second series circuit including a second number m of field effect transistors (m being a positive integer) connected in series between said two potential, a third series circuit including a third number n of field effect transistors (n being a positive integer) connected in series between said two potentials, said l, m and n being different each other, a first current source means adapted to output a current that is dependent upon a current flowing through said first series circuit in quantity, a second current source means adapted to output a current that is dependent upon a current flowing through said second series circuit in quantity, a third current source adapted to output a current that is dependent upon a current flowing through said third series circuit in quantity, and an output circuit means adapted to output a current obtained by subtracting the current of said second current source from the sum of the currents of said first current source and said third current source.

2. The constant-current circuit as claimed in claim 1, in which the current ratio among said first, second and third current source means is $$1 : \frac{m^2(n-l)}{l^2(n-m)} : \frac{n^2(m-l)}{l^2(n-m)}.$$

3. A constant-current circuit comprising a first bias potential source producing a first bias potential having a value of A, a second bias potential source producing a second bias potential having a value of B, a third bias potential source producing a third bias potential having a value of C, said A, B and C being different from each other, a first current source means producing a first current in response to said first bias potential, a second current source means producing a second current in response to said second bias potential source, a third current source means producing a third current in response to said third bias potential, and output circuit means adapted to output a current obtained by subtracting said second current from the sum of said first and third currents.

4. The circuit according to claim 3, wherein the current ratio among said first, second and third currents is:

$$1 : \frac{A(A-C)}{B(B-C)} : \frac{A(A-B)}{B(B-C)}$$

5. The circuit according to claim 3, wherein said first, second and third bias potential sources include a first number l of field effect transistors connected in series between two potential sources, a second number m of field effect transistors connected in series between two potential sources, respectively, and a third number n of field effect transistors and said l, m and n are positive integers.

6. The circuit according to claim 5, wherein the ratio among said l, m and n is:

$$l:m:n = 1/A:1/B:1/C$$

7. The circuit according to claim 5, wherein said l, m, n, A, B and C have a relation of $1/l:1/m:1/n = A:B:C$.

8. A constant-current source circuit comprising a first potential source, a second potential source, a first potential means for producing a first bias potential obtained by multiplying the potential difference between said first and second potential sources by a positive constant A, a second potential means for producing a second bias potential by multiplying said potential difference by a positive constant B, and third potential means for producing a third bias potential by multiplying said potential difference by a positive constant C, said constants A, B and C being different from each other and being smaller than 1, a first current source responsive to said first bias potential to produce a first current, a second current source responsive to said second bias potential to produce a second current, a third current source responsive to said third bias potential to produce a third current, and output means for producing an output current by subtracting said second current from the sum of said first and third currents, wherein the current ratio among said first, second and third currents is $$1 : \frac{A(A-B)}{B(B-C)} : \frac{A(A-B)}{B(B-C)}$$

9. A constant-current circuit comprising a first terminal, a second terminal, an output terminal, a first series circuit inserted between said first and second terminals including a first number l of field effect transistors each having a gate coupled to its drain, a second series circuit inserted between said first and second terminals including a second number m of field effect transistors each having a gate coupled to its drain, a third series circuit inserted between said first and second terminals including a third number n of field effect transistors each having a gate coupled to its drain, said l, m and n being different positive integers, a first field effect transistor having a gate coupled to a gate of the l-th transistor in said first series circuit and a source coupled to said second terminal, a second field effect transistor having a gate coupled to a gate of the n-th transistor in said third series circuit and a source coupled to said second terminal, a third field effect transistor having a drain coupled to said first terminal and a gate coupled to its source and drains of said first and second transistors, a fourth field-effect transistor having a drain coupled to said first terminal and a gate coupled to the gate of said third transistor, a fifth field effect transistor having a drain coupled to a source of said fourth transistor, a gate coupled to a gate of the m-th transistor in said second series circuit and a source coupled to said second terminal, a sixth field effect transistor having a drain coupled to its gate and the drain of said fifth transistor and a source coupled to said second terminal, and a seventh field effect transistor having a drain coupled to said output terminal, a gate coupled to the gate of said sixth transistor and a source coupled to said second terminal, wherein the mutual conductance ratio among said first, fifth and second transistors is $$1 : \frac{m^2(n-l)}{l^2(n-m)} : \frac{n^2(m-l)}{l^2(n-m)}$$

10. The circuit according to claim 3, wherein said first current source means, second current source means and third current source means include a first field effect transistor having a gate supplied with first bias voltage and a source supplied with a first power potential, a second field effect transistor having a gate supplied with said second bias potential and a source supplied with said first power potential, and a third field effect transistor having a gate supplied with said third bias potential and a source supplied with said first power potential, respectively, and said output circuit means includes a fourth field effect transistor having a drain coupled to a second power potential and a gate coupled to its source and drains of said first and third transistors, a fifth field effect transistor having a drain coupled to said second power potential, a gate coupled to the gate of said fourth transistor and a source coupled to the drain of said second transistor, a sixth field effect transistor having a drain coupled to the source of said fifth transistor and to its gate and a source coupled to said first power potential and a seventh field effect transistor having a gate coupled to the gate of said sixth transistor and a source coupled to said first power potential, and wherein from a drain of said seventh transistor a constantant current is output.

11. The circuit according to claim 10, wherein the ratio of mutual conductance among said first, second and third transistors is $$1 : \frac{A(A-C)}{B(B-C)} : \frac{A(A-B)}{C(B-C)}$$

* * * * *